United States Patent [19]

Chinone et al.

[11] Patent Number: 4,665,528
[45] Date of Patent: May 12, 1987

[54] DISTRIBUTED-FEEDBACK SEMICONDUCTOR LASER DEVICE

[75] Inventors: Naoki Chinone, Hachioji; Shinji Tsuji, Kokubunji; Yoshihisa Fujisaki, Setagaya; Yasutoshi Kashiwada, Nishitama; Motohisa Hirao, Suginami, all of Japan

[73] Assignee: Hitachi, Ltd., Tokyo, Japan

[21] Appl. No.: 681,820

[22] Filed: Dec. 14, 1984

[30] Foreign Application Priority Data

Dec. 14, 1983 [JP] Japan .................. 58-234238

[51] Int. Cl.⁴ ............................... H01S 3/19
[52] U.S. Cl. ........................ 372/96; 372/19; 372/50
[58] Field of Search ................ 372/96, 50, 19

[56] References Cited

U.S. PATENT DOCUMENTS 4,096,446  6/1978  Hans et al. .................. 372/96

FOREIGN PATENT DOCUMENTS 0197788  11/1983  Japan .................. 372/96

Primary Examiner—James W. Davie
Attorney, Agent, or Firm—Antonelli, Terry & Wands

[57] ABSTRACT

Disclosed is a distributed feedback semiconductor laser provided with a grating which effects optical feedback by means of periodic corrugation disposed inside an optical resonator. The optical resonator has at least two regions having different bragg wavelength, and these regions are arranged longitudinally in the direction of an optical axis. The laser device can realize stable single longitudinal mode oscillation.

9 Claims, 15 Drawing Figures 1.55 μm
WAVE LENGTH

DISTRIBUTED-FEEDBACK SEMICONDUCTOR LASER DEVICE

BACKGROUND OF THE INVENTION

1. Field of the Invention

This invention relates to a distributed-feedback semiconductor laser effecting single longitudinal mode oscillation.

2. Description of the Prior Art

A distributed-feedback semiconductor laser (hereinafter referred to as "DFB laser") has been examined which is provided with a grating inside the device in order to control the longitudinal modes of the semiconductor laser. In the conventional DFB laser, two modes having the same threshold gain exist in principle. In practical oscillation, oscillation is made in either one of these two modes. Therefore, it has been difficult to obtain single longitudinal mode oscillation with high reproducibility because of the structural variance when fabricating the laser devices.

Typical prior art references relating to the DFB laser are listed below:

(1) T. Matsuoka et al., Electron Lett., 18, 28(1982)
(2) S. Akiba et al., Jpn. J. Appl. Phys., 21, 1736(1982)

SUMMARY OF THE INVENTION

The present invention is directed to provide a DFB laser which stably oscillates in a single mode.

In a DFB laser the fundamental constituents are an active layer for emitting the light by an injected carrier, a cladding layer for confining the carrier in the active layer and a grating for causing distributed-feedback. In the conventional DFB laser, a longitudinal mode closest to the Bragg wavelength, which is determined by the period of the grating, has the smallest threshold gain, and one each longitudinal mode exists on both sides of the Bragg wavelength. Therefore, it has been difficult to obtain a complete single mode. In other words, mode hopping occurs due to variance of devices produced or to the changes in temperature and current. To prevent this problem, two regions having different Bragg wavelengths are disposed in the direction of the optical axis of the device, and the wavelength of one longitudinal mode that has the smallest threshold gain in one of the regions is superposed with the wavelength of one longitudinal mode that has the smallest threshold gain in the other region. Since the longitudinal mode thus superposed has a smaller threshold gain than any other mode, stable single mode oscillation can be obtained.

The present invention will be described in further detail.

The longitudinal mode of the distributed-feedback laser has modes such as $\lambda_{11}, \lambda_{12} \ldots, \lambda_{21}, \lambda_{22} \ldots$ with the Bragg wavelength ($\lambda_b$) being the center as shown in FIG. 1a. In the ordinary distributed-feedback laser, either one of $\lambda_{11}$ and $\lambda_{21}$ having the smallest threshold gain in each mode causes oscillation.

The Bragg wavelength ($\lambda_b$) can be expressed by the following formula with $\Delta$ representing the period of the grating:

$$\lambda_b = 2 n_{eff} \Delta$$

where $n_{eff}$ is an effective refractive index, which is given by the following formula:

$$n_{eff} = \beta / R_0$$

where $R_0 = 2\pi/\lambda$, $\lambda$ is an oscillation wavelength and $\beta$ is a propagation constant.

These constants are explained in the literature directed to the basic theory of the optical waveguide or semiconductor lasers. Refer, for example, to "HETEROSTRUCTURE LASERS", H. C. Casey, M. B. Panish, ACADEMIC PRESS, and the like.

Under the state described above, stable single mode oscillation can not be realized because the modes of $\lambda_{11}$ and $\lambda_{21}$ have the same threshold gain, and mode hopping occurs due to the changes in temperature and current.

Therefore, two regions I ($\lambda_{bA}$) and II ($\lambda_{bB}$) having different Bragg wavelength ($\lambda_b$) are cascaded in the direction of the optical axis in such a fashion that the modes $\lambda_{bA1}$ and $\lambda_{bB1}$ having the smallest threshold gain in the regions I and II overlap with each other. FIGS. 1b and 1c show this state. If a setting is made in this manner, only a single mode of the synthesized modes of the regions I and II has the smallest threshold gain. This state is illustrated in FIG. 1d. Therefore, oscillation always occurs in this mode ($\lambda_{AB}$), and complete single mode oscillation can be obtained.

Incidentally, the gap between the Bragg wavelength (e.g. $\lambda_{bA}$) and the adjacent mode (e.g. $\lambda_{bA1}$) can be expressed as follows:

$$\lambda_{bA}^2 / n_{eff} L$$

where L is a cavity length.

As is obvious from the relation $\lambda_b = 2 n_{eff} \Delta$, the Bragg wavelength in a given region can be made different from that in other regions by, in principle, changing either $n_{eff}$ or $\Delta$.

The effective refractive index $n_{eff}$ can be changed by changing the thickness of a laminate forming a waveguide or its composition. For example, the thickness of the active layer itself or the thickness of the optical guiding layer or cladding layer may be changed. A more definite construction will be explained in the embodiment of the invention that will follow.

The foregoing description deals with the case where the grating inside the cavity is divided into two regions, but it may of course be divided into a greater number of regions.

Though the foregoing description deals with the control of the longitudinal mode, heretofore known methods may be used to control the mode in a direction crossing at right angles to the travelling direction of the laser light, i.e., the so-called "transverse mode". For example, a BH type (Buried Heterostructure) may be freely used in combination.

The present invention can realize single longitudinal mode oscillation with high reproducibility without being affected by the variance of devices.

DESCRIPTION OF THE PREFERRED EMBODIMENTS

Hereinafter, some preferred embodiments of the present invention will be described.

Figure 1A:
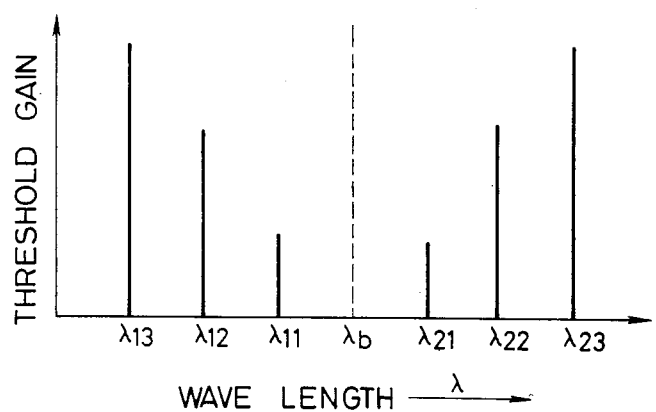
FIGS. 1a, 1b, 1c and 1d are diagrams useful for explaining the principle of the present invention.
Figure 1B:
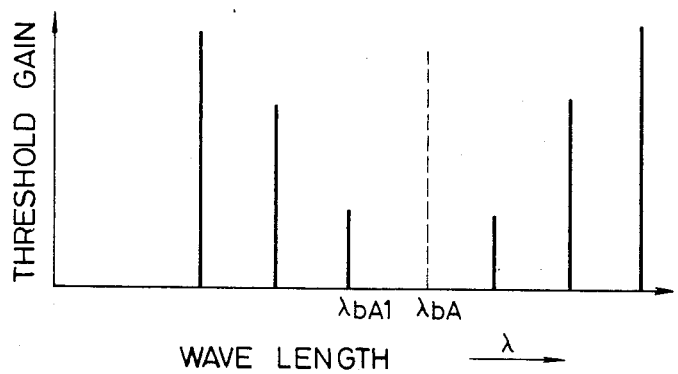
Figure 1C:
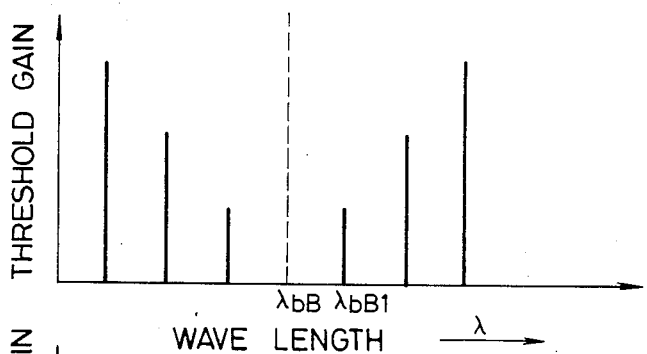
Figure 1D:
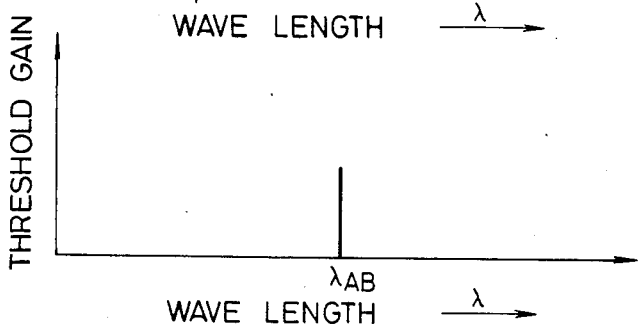
Figure 2:
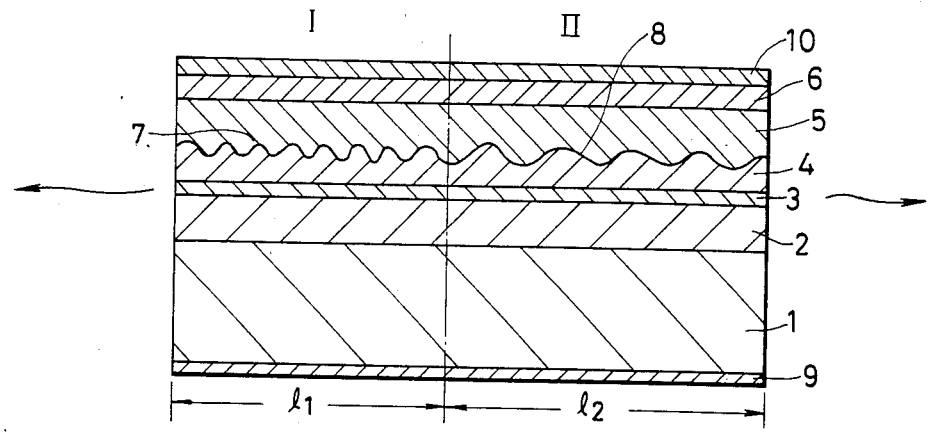
FIG. 2 is a sectional side view of a DFB laser in accordance with one embodiment of the present invention.

FIG. 2 is a sectional view of the DFB laser on a plane parallel to the travelling direction of light. As shown in the drawing, an n-type InP layer (which is a buffer layer and is about 2 μm thick) 2, an $In_{0.582}Ga_{0.418}As_{0.898}P_{0.102}$ layer (active layer; 0.1 μm thick) 3, and a p-type $In_{0.717}Ga_{0.283}As_{0.613}P_{0.387}$ layer (optical guiding layer, up to 0.1 μm thick) 4 are sequentially formed by a known liquid epitaxial method on an n-type InP substrate 1. A photoresist layer is formed on the surface of the optical guiding layer 4, and a pattern having a desired periodic corrugation is exposed by a known laser beam interference method. In this case, the periods in the regions I and II are made different from each other as shown in FIG. 2. In this embodiment, the period in the region I is 2,300 Å and that in the region II, 2,315 Å.

Next, the surface of the p-type InGaAsP layer 4 is selectively etched using the photoresist described above as the mask and an etching solution consisting of a mixed solution of HBr, $HNO_3$ and $H_2O$ to form the periodic corrugation. The recess is up to 300 Å deep. After this periodic corrugation is formed, a p-type InP cladding layer (up to 1.0 μm thick) 5 and a p-type $In_{0.814}Ga_{0.186}As_{0.405}P_{0.595}$ layer 6 (contact layer; up to 0.5 μm thick) are again grown sequentially. An n-electrode 9 consisting of Au-Sn and a p-electrode 10 consisting of Cr-Au are formed on the side of the n-type InP substrate and on the side of p-type InGaAsP, respectively, and the devices are separated, whenever necessary. The cavity length is 300 μm.

Figure 3:
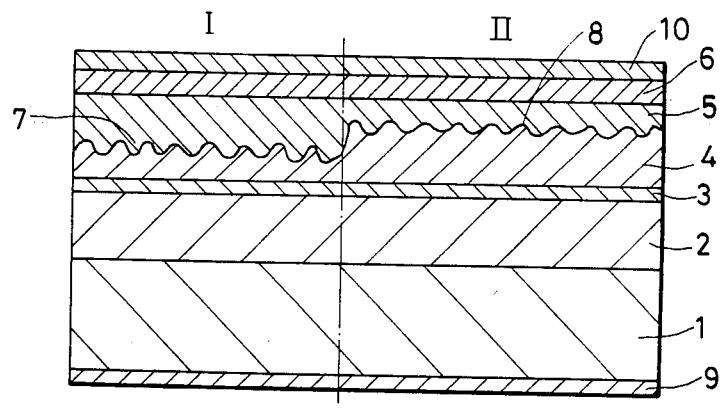
FIG. 3 is a sectional side view of the DFB laser in accordance with another embodiment of the present invention.
Figure 4:
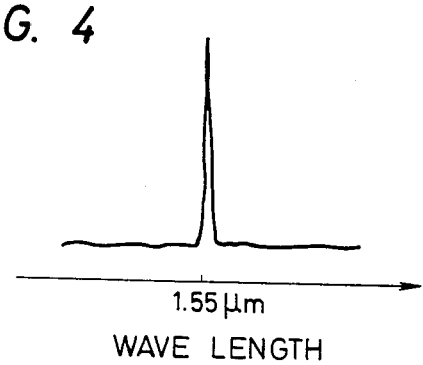
FIG. 4 is a diagram showing the oscillation spectrum of the device in accordance with the present invention.

FIG. 3 shows another embodiment of the present invention. The layers up to the optical guiding layers 4 are grown in the same way as in the embodiment shown in FIG. 2, and the thickness of the optical guiding layer in only the region I is reduced by selective etching. Next, corrugation having the same period is formed on both regions. Since the thickness of the optical guiding layer between the regions I and II is different, their effective refractive indices are different, so that their Bragg wavelengths are also different. Equivalently, therefore, the change of the thickness of the Bragg wavelength is equal to the change of the effective refractive index ($n_{eff}$). To cite an example, the period of corrugation is 2,300 Å, the thickness of the optical guiding layer in the region I is 0.1 μm and the thickness of the optical guiding layer in the region II is 0.15 μm. In the case of this device, too, complete single mode oscillation of a 1.55 μm wavelength can be obtained as shown in FIG. 4.

Incidentally, the same reference numerals are used in FIG. 3 to identify the same portions as in FIG. 2.

FIGS. 5 through 11 are sectional views of semiconductor laser devices in accordance with other embodiments of the present invention. All of them are sectional views on the plane parallel to the travelling direction of the laser light in the same way as in FIG. 2, and like reference numerals are used to identify like portions as in FIG. 2.

Figure 5:
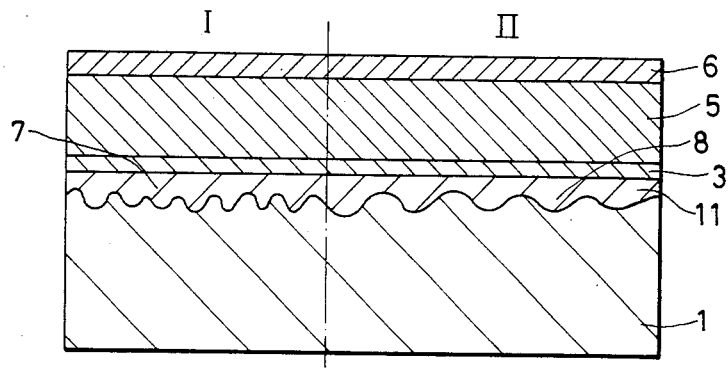
FIGS. 5 through 12 are sectional side views in accordance with other embodiments of the present invention.

FIG. 5 shows the embodiment in which periodic corrugations 7 and 8 are disposed on the side of the substrate 1 with respect to the active layer. A semiconductor layer 11 is the optical guiding layer, and an n-type $In_{0.717}Ga_{0.283}As_{0.613}P_{0.387}$ layer may be used, for example. The compositions of the other layers may be the same as in the embodiment shown in FIG. 2. Incidentally, the n-type InGaAsP layer is 0.1 μm thick.

Figure 6:
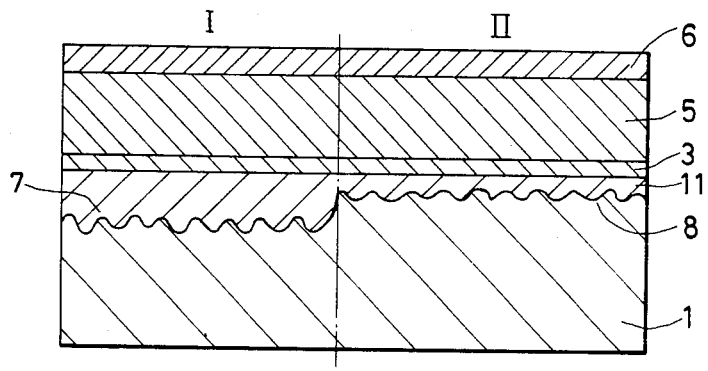

FIG. 6 shows the embodiment in which the periodic corrugations 7 and 8 are disposed also on the side of the substrate, and the thickness of the optical guiding layer 11 is different between the regions I and II. In this embodiment, the period of the periodic corrugations 7 and 8 is the same, i.e., 2,300 Å. The optical guiding layer 11 uses the afore-mentioned n-type $In_{0.717}Ga_{0.283}As_{0.613}P_{0.387}$ layer, for example, and the thickness is 0.2 μm for the region I and 0.1 μm for the region II.

Figure 7:
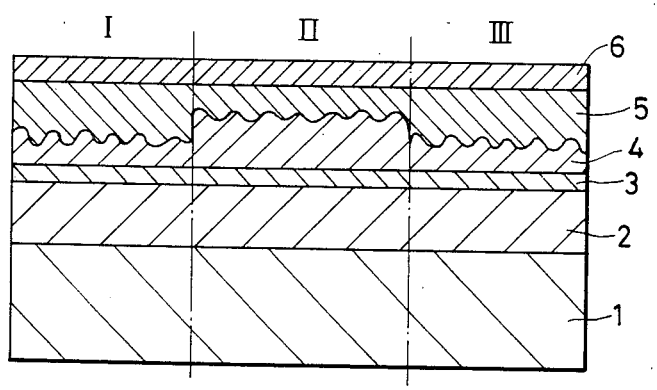

FIG. 7 shows the embodiment in which three different periodic regions are disposed. In this embodiment, the thickness of the optical guiding layer 4 is the same in the right and left regions I and III, and is greater in the region II. The period of the periodic corrugation is the same throughout the three regions I, II and III.

Figure 8:
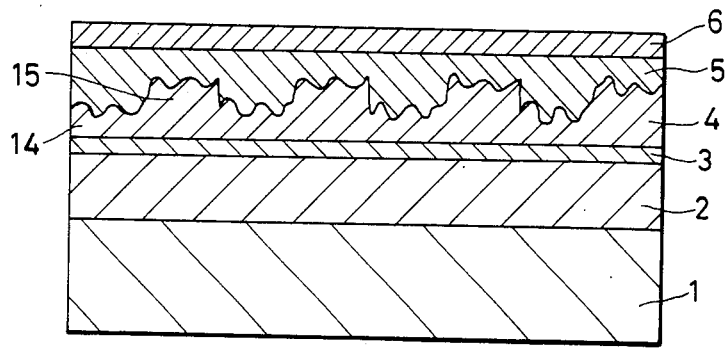

FIG. 8 shows the embodiment in which a large number of regions 15 having thick optical guiding layers and a large number of regions 14 having thin optical guiding layer are alternately disposed. The rest of constructions may be the same as in the embodiment shown in FIGS. 2 or 7.

The foregoing embodiments use the method of differentiating the period of the periodic corrugations of the grating or the method of differentiating the thickness of the optical guiding layers in order to differentiate the effective refractive indices ($n_{eff}$) of the divided regions. However, it is of course possible to use both of these methods in combination.

Figure 9:
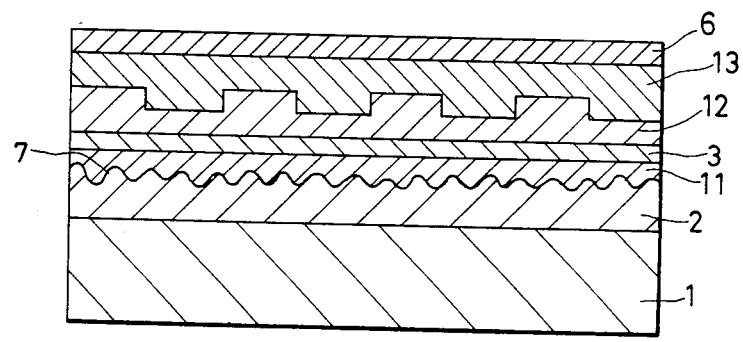

FIG. 9 shows the embodiment in which the period of the periodic corrugation 7 of the grating is the same, the thickness of the optical guiding layer 11 is also constant, but the thickness of one of the cladding layers 12 is periodically changed in order to make different the Bragg wavelengths ($\lambda_b$) of the divided regions inside the optical resonator.

Figure 10:
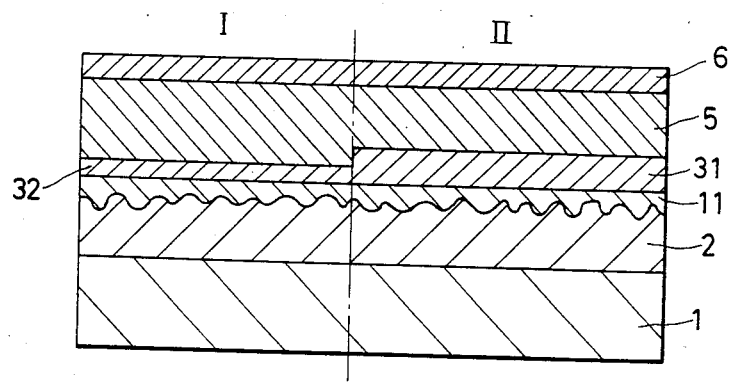

FIG. 10 shows the embodiment in which the thickness of the active layers is different. For example, they are 0.1 μm thick and 0.15 μm thick, to constitute the regions I and II, respectively. The same object can also be accomplished by changing their compositions while keeping the thickness of the active layer constant.

Figure 11:
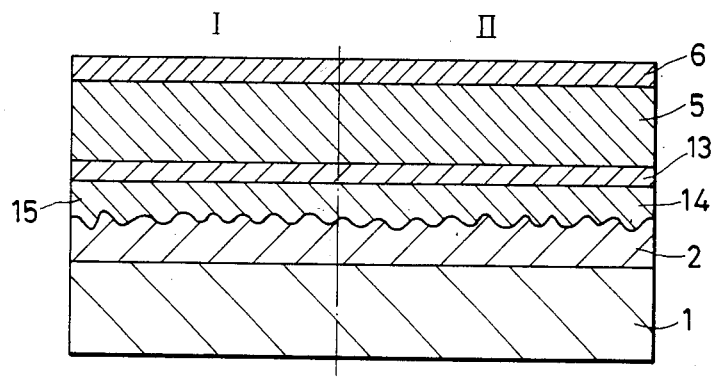

FIG. 11 shows the embodiment in which the compositions of the optical guiding layers 14 and 15 are changed. For example, the compositions may be selected so that the optical guiding layer 14 has a band gap wavelength of 1.3 μm and the optical guiding layer 15, a band gap wavelength of 1.25 μm.

Though the foregoing embodiments deal with the InPInGaAsP system semiconductor lasers, the present invention can of course be applied widely to compound semiconductor lasers such as GaAs-GaAlAs system lasers.

Figure 12:
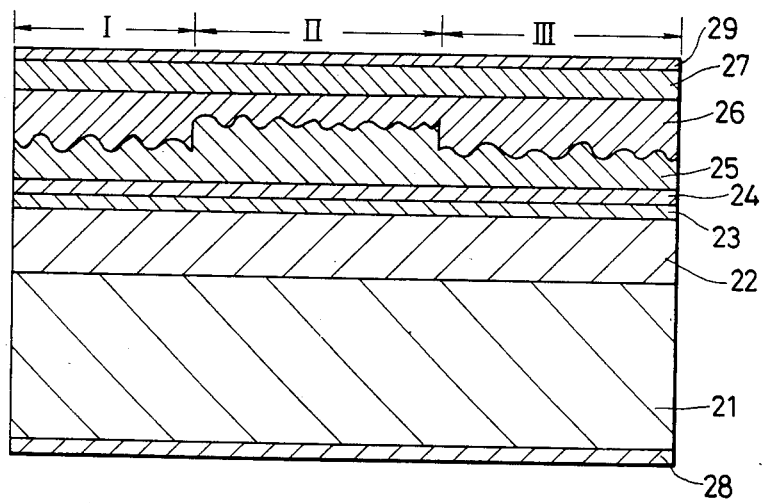

FIG. 12 shows the embodiment of the GaAs-GaAlAs system. The fundamental construction is the same as that of the embodiment shown in FIG. 7.

An n-type $Ga_{0.6}Al_{0.4}As$ cladding layer (2.0 μm thick), an undoped $Ga_{0.95}Al_{0.05}As$ active layer (0.1 μm thick), a p-type $Ga_{0.6}Al_{0.4}As$ blocking layer (0.05 μm thick), a p-type $Ga_{0.8}Al_{0.2}As$ optical guiding layer, a p-type $Ga_{0.6}Al_{0.4}As$ cladding layer (1.0 μm) and a p- type GaAs cap layer (0.5 μm thick) are arranged on an n-type GaAs substrate 21. In this embodiment, the optical resonator is divided into the regions I, II and III, and these regions are 0.1 μm thick, 0.2 μm thick and 0.1 μm thick, respectively. The pitch of the periodic corrugation is 2,370 Å and its height, 500 Å.

An electrode 29 is made of Cr-Au, while an electrode 28 consists of a laminate layer of AuGeNi-Au.

What is claimed is:

1. In a distributed feedback semiconductor laser device equipped with a grating for effecting optical feedback by means of periodic corrugation inside an optical resonator, the improvement wherein said optical resonator has at least two regions of different Bragg wavelengths, said regions being arranged longitudinally in the direction of an optical axis, and wherein the selected Bragg wavelength of each of said at least two regions is selected so that the wavelength of one of modes having the smallest threshold gain and being the nearest to the Bragg wavelength of one of said regions, and the wavelength of one of modes having the smallest threshold gain and being the nearest to the Bragg wavelength of another of said regions substantially agree with each other.

2. The distributed feedback semiconductor laser device as claimed in claim 1 wherein said regions of said optical resonator comprise a plurality of regions of said grating having periodic corrugations having different periods.

3. The distributed feedback semiconductor laser device as defined in claim 1 wherein said regions of said optical resonator comprise a plurality of regions of said grating having different distances between an active layer and the surface of said periodic corrugation.

4. The distributed feedback semiconductor laser device as defined in claim 2 wherein said regions of said optical resonator comprise a plurality of regions of said grating having different distances between an active layer and the surface of said periodic corrugation.

5. The distributed feedback semiconductor laser device as defined in claim 1 wherein said regions of said optical resonator comprise a plurality of said regions of said grating having a difference of thickness in semiconductor layers having a smaller refractive index than an active layer existing on the side opposite to the side on which said corrugation exists, with said active layer being the center.

6. The distributed feedback semiconductor laser device as defined in claim 1 wherein the thickness of active layers of a plurality of said regions of said optical resonator are different from one another.

7. The distributed feedback semiconductor laser device as defined in claim 1 wherein optical guiding layers of a plurality of said regions of said optical resonator have different compositions.

8. The distributed feedback semiconductor laser device as defined in claim 1 wherein the thickness of cladding layers of a plurality of said regions of said optical resonator are different from one another.

9. In a distributed feedback semiconductor laser device equipped with a grating for effecting optical feedback by means of periodic corrugation inside an optical resonator, the improvement wherein said optical resonator has at least two regions which are of different construction from one another so that said two regions have different Bragg wavelengths from one another, said regions being arranged longitudinally in the direction of the optical axis, and wherein the oscillating wavelengths of said laser is a single mode which corresponds to respective modes of said at least two regions which modes have the smallest threshold gain and are nearest to the Bragg wavelengths of said at least two regions.

* * * * *